United States Patent
Garbelli et al.

[11] Patent Number: 6,049,464
[45] Date of Patent: Apr. 11, 2000

[54] ELECTRONIC MODULES MANUFACTURING

[75] Inventors: Francesco Garbelli, Arcore; Alberto Monti, Paderno Dugnano; Stefano Oggioni, Vimercate, all of Italy

[73] Assignee: International Business Machines Corporation, Armonk, N.Y.

[21] Appl. No.: 08/978,303

[22] Filed: Nov. 25, 1997

[30] Foreign Application Priority Data

Dec. 4, 1996 [GB] United Kingdom ............... 9625233

[51] Int. Cl.⁷ ..................................... H05K 7/12
[52] U.S. Cl. .................. 361/760; 361/763; 361/764; 361/765; 361/820; 257/723; 257/724; 257/727; 257/731; 257/733; 257/737; 257/738; 439/940
[58] Field of Search ............................. 361/760, 763, 361/764, 765, 820; 439/940; 257/723, 724, 727, 731, 733, 737, 738

[56] References Cited

U.S. PATENT DOCUMENTS

| | | | |
|---|---|---|---|
| 4,667,944 | 5/1987 | Althouse | 269/21 |
| 4,837,184 | 6/1989 | Lin et al. | 437/217 |
| 5,055,971 | 10/1991 | Fudala et al. | 361/760 |
| 5,571,022 | 11/1996 | Schaarschmidt | 439/135 |
| 5,681,174 | 10/1997 | Correll, Jr. et al. | 439/135 |
| 5,688,133 | 11/1997 | Ikesugi et al. | 439/135 |
| 5,694,300 | 12/1997 | Mattei et al. | 361/818 |
| 5,726,612 | 3/1998 | Mandai et al. | 333/184 |

FOREIGN PATENT DOCUMENTS

| | | |
|---|---|---|
| 0 548 583 | 6/1993 | European Pat. Off. . |
| 0675538 | 10/1995 | European Pat. Off. ...... H01L 23/367 |
| 0 633 634 | 1/1996 | European Pat. Off. . |
| 0 706 314 | 4/1996 | European Pat. Off. . |
| 0 716 483 | 6/1996 | European Pat. Off. . |
| 29617668 | 6/1989 | Germany ............. H05K 13/02 |
| 2 294 678 | 5/1996 | United Kingdom . |

*Primary Examiner*—Leo P. Picard
*Assistant Examiner*—David Foster
*Attorney, Agent, or Firm*—John R. Pivnichny

[57] ABSTRACT

In the manufacturing process of electronic modules a problem could arise when the modules have non-flat top surface. This is due to the fact that most of the automatic picking tools uses a vacuum nozzle to pick and place the module. According to the present invention a flat feature (a cap or a stud) is added to the module. This flat feature can be either fixed on the module or removable after the manufacture in order to reduce the dimensions.

12 Claims, 3 Drawing Sheets

ELECTRONIC MODULES MANUFACTURING

TECHNICAL FIELD

The present invention relates to the manufacturing of electronic modules and more particularly to a method for improving the handling of the modules during manufacturing processes.

BACKGROUND OF THE INVENTION

The recent developments in the technology of manufacturing processes of the electronic packages caused the human intervention to be more and more limited. The handling of the components is almost totally done by automatic machines. For example the picking and placing of electronic modules to be mounted on appropriate substrates is an operation usually controlled and performed by machines. A typical equipment used in the manufacturing of electronic packages is a vacuum pick up which has a nozzle ending with a flat surface having a hole in the middle. When the nozzle is brought near the component to be picked up, vacuum is applied through the hole and the component is firmly tight to the nozzle and can be easily moved. This method has been proved to be very reliable and highly flexible, because it can be applied to components having a wide range of dimensions. A problem with the above method is that the component to be picked and placed must have a flat surface and this is not always possible.

Let's consider, as an example, the case of the Plastic Ball Grid Array (P-BGA) technology. This technology uses Printed Circuit Board (PCB) laminates as substrate for the manufacturing of electronic modules which can be of the Single Chip Module (SCM) type or Multi Chip Module (MCM) type. These modules are provided with a plurality of conductive pads for the electrical connection with electronic circuits (such as mother boards, back planes, application boards). The electrical connection is achieved by little spherical portions of solder alloy which give the name of Ball Grid Array (BGA) to this kind of electronic module. These modules are usually called Plastic Ball Grid Array. The definition "Plastic" indicates the flexible nature of the PCB as opposed to a ceramic substrate.

FIG. 1 is an example of a section of a BGA module of the MCM type. On the lower face of the laminate 101 there is a plurality of conductive pads each pad provided with a solder ball 104 which will be put in contact with an electronic circuit and reflowed, thereby realizing the electrical connection. On the upper face of the module there are the active elements 102 protected by a resin cover 103 which is placed during the manufacturing process immediately after having mounted the active elements 103 on the laminate substrate. This cover is necessary for protecting the active devices 103 from external environment. In the module shown in FIG. 1 the Blob Top (also called Glob Top) method has been used. With Blob Topping a fluid resin is dispensed at relatively low temperature (usually lower than 90 C). FIG. 2 is a top view of the package of FIG. 1.

With the electronic packages described above the use of a vacuum pick up is not suitable because of the irregular surface of the modules. On the other hand, substituting the above described glob topping with a flat surfaced topping could sometimes involve some problems. In the case, for example, of MCM modules described in the example above, the attempt to cover all the chips on the substrate with a single flat cap using liquid encapsulant would cause "warpage" problems. Package warpage is a very well known effect and it is mainly due to the difference of the Coefficient of Thermal Expansion (CTE) between the different materials used in the manufacturing of the BGA modules (e.g. resin of the topping and silicon of active devices). The temperature at which the resins for the encapsulants are dispensed is higher than the utilisation temperature and the resins usually reduce their volume after polymerisation. This means that the temperature decrease causes a shrinkage of the resins which determines a tension build up in the module when it is cooled from the processing temperature down to the room temperature; the module at the end of the assembly presents a deformation with the four corners of the laminate lifted with respect to the center. This is the above mentioned warpage effect, which can impact long term reliability of the module and cause problems in card assembly because of the non-coplanarity of the balls or leads: peripheral balls or leads might not touch solder screen printed on the board thus leading to an open circuit condition after reflow. To reduce the warpage effect each single silicon chip assembled on a MCM module must be separately covered with a resin cap in the way described above thus obtaining a non flat top surface with a plurality of distributed glob top mounds.

An alternative solution would be the use of tools which grip the modules along their sides. This solution has however some drawbacks due to the fact that a custom designed pick up tool is needed for each different module. Furthermore some modules could be not suitable to be picked up through the sides due to the particular shape.

It is an object of the present invention to provide a technique which alleviates the above drawbacks.

SUMMARY OF THE INVENTION

According to the present invention we provide an electronic module having a non-flat top surface characterized in that it further comprises a flat feature for facilitating the automatic picking of the module during the manufacturing process.

Further according to the present invention we provide a method, in the manufacturing of electronic modules having a non-flat top surface, of adding a flat feature for facilitating the automatic picking of the module by means of picking tools.

DETAILED DESCRIPTION OF THE PREFERRED EMBODIMENT

According to a preferred embodiment of the present invention, to overcome the problem of the non-flat top surface, a flat feature is added to an electronic module in order to allow to be picked with standard picking means requiring flat surfaces. This flat feature can be realised with different shapes and materials and attached to the module with different methods to fit different module shapes and satisfy different requirements.

Figure 1:
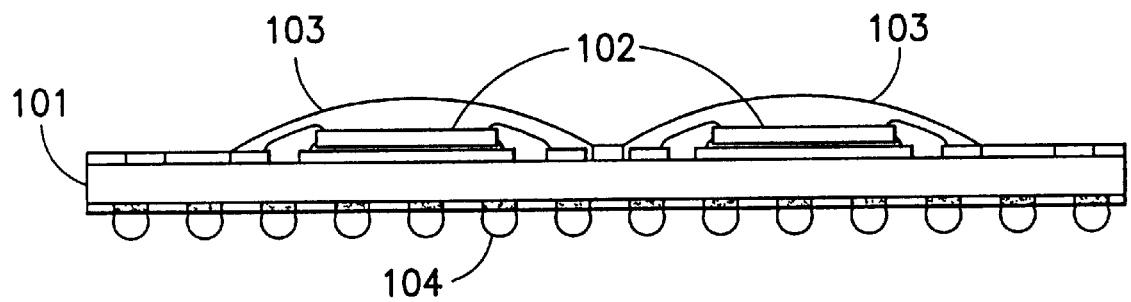
FIG. 1 is a schematic representation of a prior art BGA module.
Figure 2:
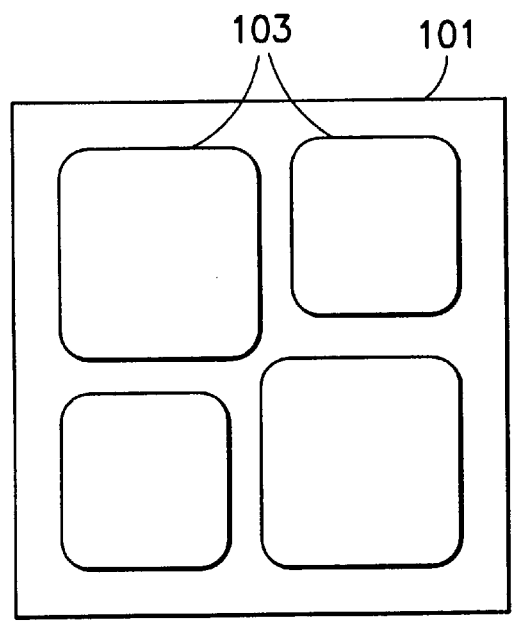
FIG. 2 is a top view of a prior art BGA module.
Figure 3A:
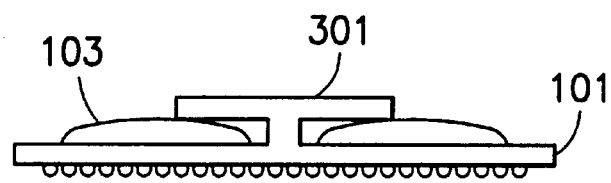
FIGS. 3A, 3B, 4, 5A and 5B are schematic representation of preferred embodiments of the present invention.
Figure 3B:
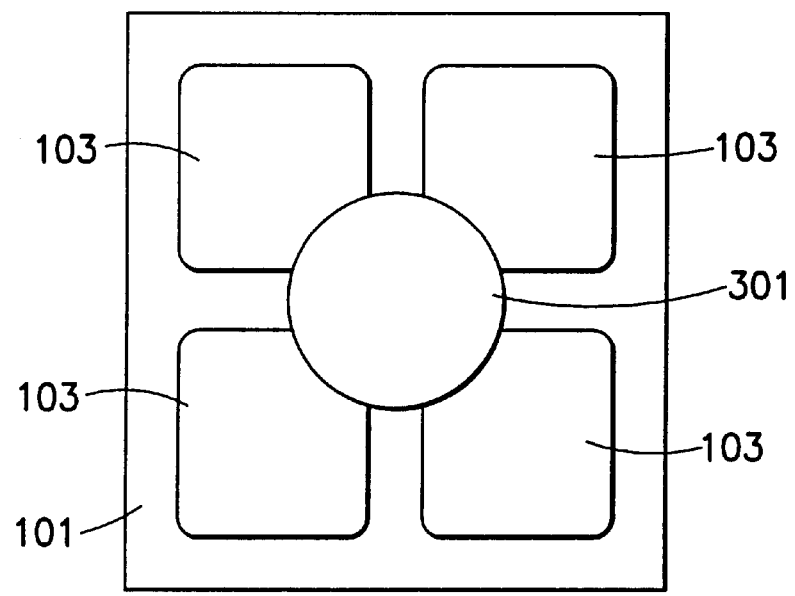

With reference to FIGS. 3A and 3B a preferred embodiment of the present invention is shown. On the MCM module represented four components 103 are attached on the substrate and each one is covered by a protective resin cap of irregular shape. In the middle of the module substrate there is a portion free from components where a mushroom shaped stud is placed. This mushroom stud can be either permanently fixed (e.g. glued) or removably attached (e.g. press fitted) on the module. The flat surface allows the module to be picked up by a vacuum pick up machine or by all the picking tools requiring a flat surface. In case of press fitting, the stud can be easily removed after assembly of the module in order to reduce the profile of the final package. This is particularly useful when space saving is a critical requirement.

Figure 4:
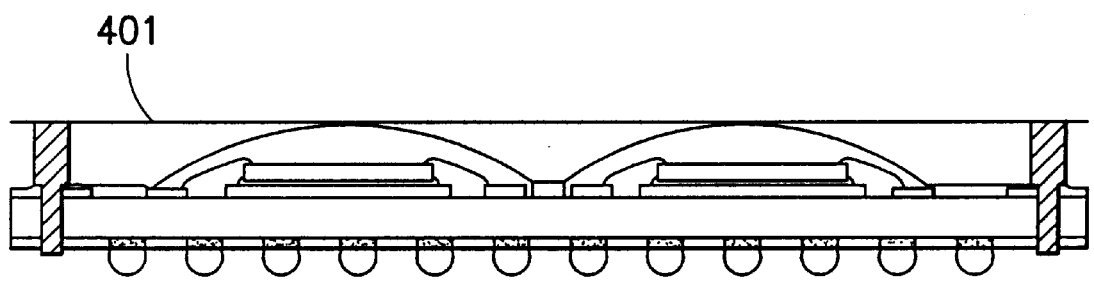
Figure 5A:
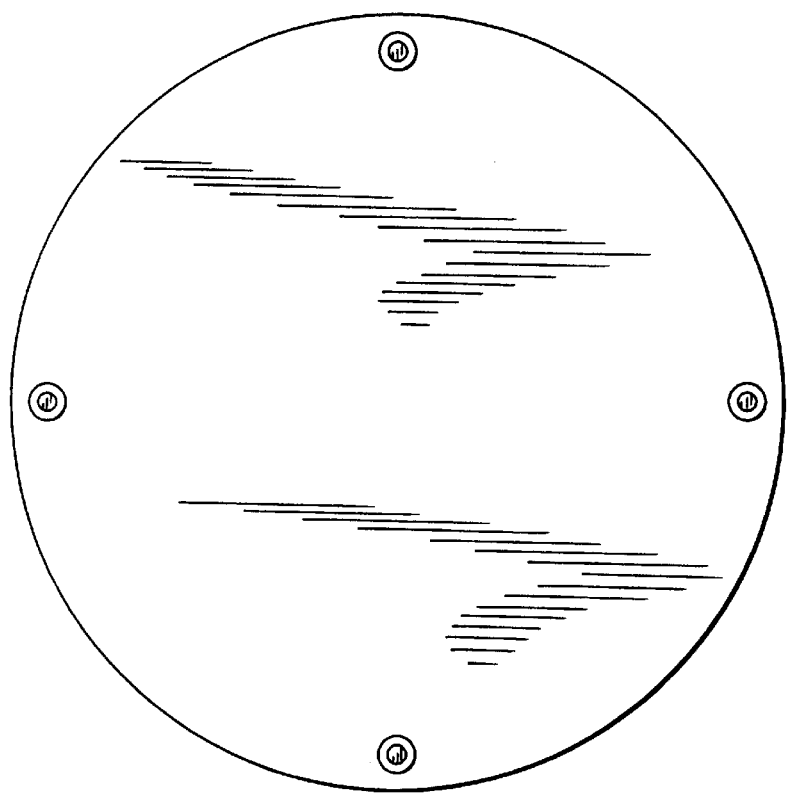
Figure 5B:
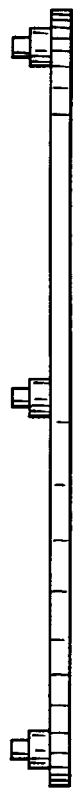

FIG. 4 shows a different embodiment of the present invention. In this case a free central portion is not available. A round cap 401 as also represented in FIGS. 5A and 5B is used. The cap 401 is connected to the module substrate 101 through four spacers positioned along the four sides of the substrate 101 in the middle. This position should minimise the impact of the module warpage on the disc. In the example of FIG. 4 the cap is press fitted and then removable, but could as well be glued or permanently fixed in any different way (e.g. rivetted).

The material used for the manufacture of the stud or the cap of the preferred embodiments described above can be any light weight material (e.g. plastic), but in case the MCM module has a high generation of heat a highly thermal conductive material could be employed. In this way the cap or the stud work as finned heat sinks. The space between the cap and the electronic components can also be filled with resin or thermal grease.

If a metallic material is used for the manufacture of the disc cap 401, a RFI (Radio Frequency Interference) shield can be realised by connecting the metal disc to the Ground signal plane/network. A Fraday Cage could also be realised.

Another possible additional use of the cap 401 is to print on it the identification data of the module, otherwise very difficult to be placed in case of a plurality of distributed glob top mounds.

What is claimed is:

1. An electronic module having a non-flat top surface characterized in that it further comprises a removable flat feature for facilitating the automatic picking of the module during the manufacturing process.

2. The electronic module of claim 1 wherein the flat feature is mushroom shaped.

3. The electronic module of claim 1 wherein the flat feature is positioned in a central portion of the module.

4. The electronic module of claim 1 wherein the flat feature has the shape of a disc.

5. The electronic module of claim 4 wherein the flat feature is attached to the module substrate by means of a plurality of spacers.

6. The electronic module of claim 1 wherein the flat feature is of plastic material.

7. The electronic module of claim 1 wherein the flat feature is of highly thermal conductive material.

8. The electronic module of claim 1 wherein the module is of the Ball Grid Array (BGA) type.

9. The electronic module of claim 8 wherein the module is of the Multi Chip Module (MCM) type.

10. The electronic module of claim 1 wherein the flat feature is separated from the active components by means of a layer of resin positioned between the flat feature and the active components.

11. A method, in the manufacturing of electronic modules having a non flat top surface, of adding a removable flat feature for facilitating the automatic picking of the module by means of picking tools.

12. The method of claim 11 further comprising the step of picking and moving the module by means of a vacuum pick up tool.

* * * * *